United States Patent
Chen et al.

(10) Patent No.: US 12,354,647 B2
(45) Date of Patent: Jul. 8, 2025

(54) MEMORY DEVICE SENSE AMPLIFIER CONTROL

(71) Applicant: Taiwan Semiconductor Manufacturing Company, Ltd., Hsinchu (TW)

(72) Inventors: Chien-Yuan Chen, Hsinchu (TW); Hau-Tai Shieh, Hsinchu (TW); Cheng Hung Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 128 days.

(21) Appl. No.: 18/158,108

(22) Filed: Jan. 23, 2023

(65) Prior Publication Data

US 2024/0096400 A1   Mar. 21, 2024

Related U.S. Application Data

(60) Provisional application No. 63/376,535, filed on Sep. 21, 2022.

(51) Int. Cl.
| | | |
|---|---|---|
| *G11C 7/00* | (2006.01) | |
| *G11C 11/4091* | (2006.01) | |
| *G11C 11/4093* | (2006.01) | |
| *G11C 11/4094* | (2006.01) | |

(52) U.S. Cl.
CPC ...... *G11C 11/4091* (2013.01); *G11C 11/4093* (2013.01); *G11C 11/4094* (2013.01)

(58) Field of Classification Search
CPC .................................................. G11C 11/4091
USPC ................................................... 365/203, 205
See application file for complete search history.

(56) References Cited

U.S. PATENT DOCUMENTS

| | | | |
|---|---|---|---|
| 8,467,257 B1 | 6/2013 | Liu et al. | |
| 9,679,619 B2 | 6/2017 | Sieh et al. | |
| 2010/0284232 A1* | 11/2010 | Wang | G11C 7/12 365/194 |
| 2012/0327730 A1 | 12/2012 | Chen et al. | |
| 2017/0309330 A1* | 10/2017 | Pyo | G11C 13/004 |
| 2020/0118617 A1* | 4/2020 | Kumar | G11C 11/417 |

* cited by examiner

*Primary Examiner* — Hoai V Ho
(74) *Attorney, Agent, or Firm* — Merchant & Gould P.C.

(57) ABSTRACT

A memory device includes a memory bank with a memory cell connected to a local bit line and a word line. A first local data latch is connected to the local bit line and has an enable terminal configured to receive a first local clock signal. A word line latch is configured to latch a word line select signal, and has an enable terminal configured to receive a second local clock signal. A first global data latch is connected to the first local data latch by a global bit line, and the first global data latch has an enable terminal configured to receive a global clock signal. A global address latch is connected to the word line latch and has an enable terminal configured to receive the global clock signal. A bank select latch is configured to latch a bank select signal, and has an enable terminal configured to receive the second local clock signal.

20 Claims, 12 Drawing Sheets

MEMORY DEVICE SENSE AMPLIFIER CONTROL

CROSS-REFERENCE TO RELATED APPLICATIONS

This application claims the benefit of U.S. Provisional Application No. 63/376,535, filed Sep. 21, 2022, and titled "MEMORY DEVICE SENSE AMPLIFIER CONTROL," the disclosure of which is hereby incorporated herein by reference.

BACKGROUND

A common type of integrated circuit memory is a static random access memory (SRAM) device. A typical SRAM memory device has an array of memory cells. Each memory cell uses six transistors, for example, connected between an upper reference potential and a lower reference potential (typically ground) such that one of two storage nodes can be occupied by the information to be stored, with the complementary information stored at the other storage node.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
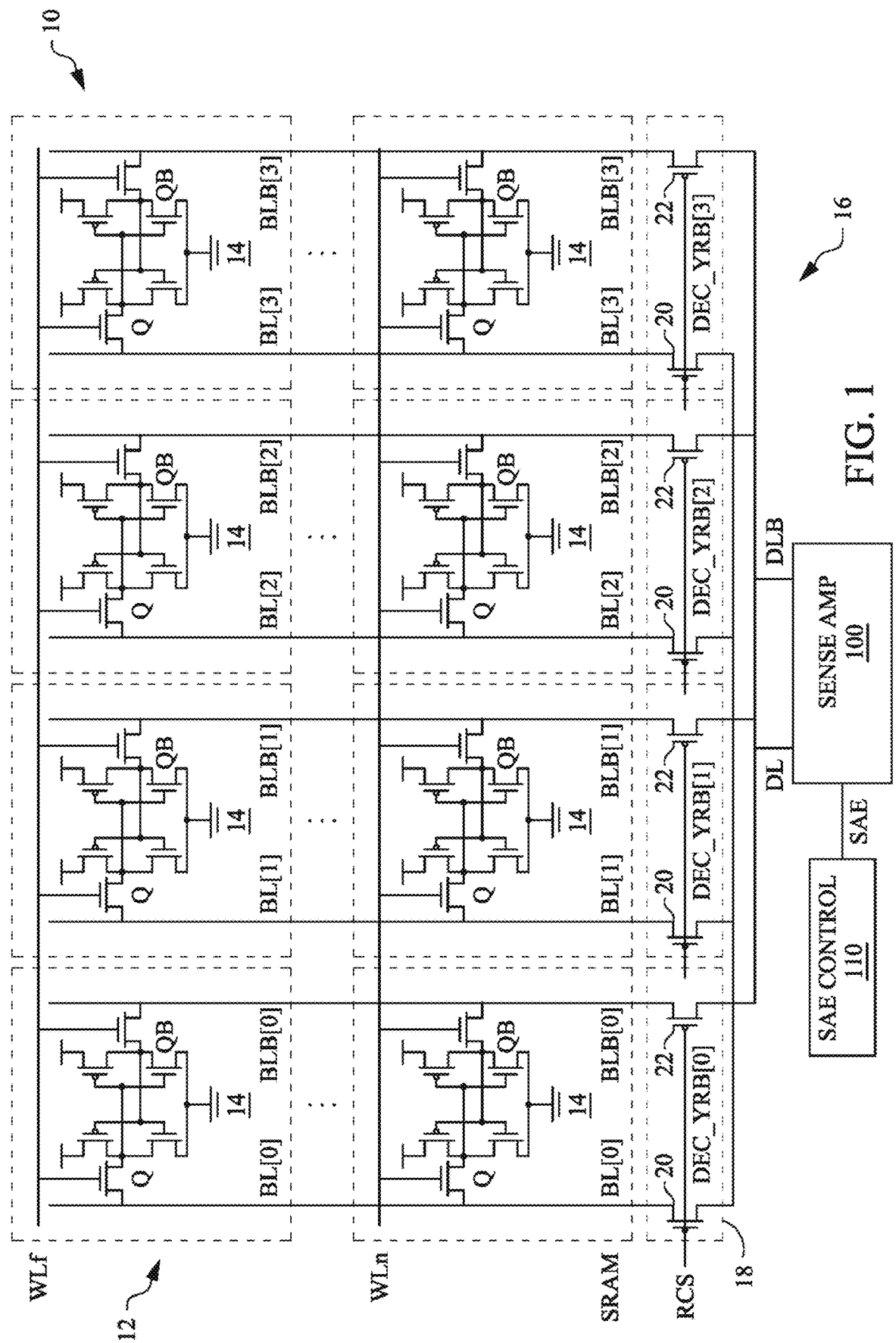
FIG. 1 is a circuit diagram illustrating aspects of an example memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some disclosed examples provide a sense amplifier system that operates to improve performance of a memory system by selectively enabling a sense amplifier based on a read margin of its data lines. Read margin generally refers to the voltage difference between the data lines of the sense amplifier when reading data from the memory. If the data lines demonstrate a sufficient read margin prior to issuance of a global enable signal by a memory controller, a sense amp enable signal is output based on the read margin. If the read margin does not reach a predetermined value prior to issuance of the global enable signal by the memory controller, the sense amp enable signal is output based on the global enable signal from the memory controller.

FIG. 1 illustrates a memory device 10 in accordance with various embodiments. In the embodiment of FIG. 1, the memory device 10 is an SRAM memory, though SRAM is used for illustration. Other types of memories are within the scope of the disclosure. In the illustrated embodiment of FIG. 1, the memory device 10 includes a memory cell array 12 with an array of memory cells 14. The memory cells 14 (sometimes referred to as "bit cells") are arranged in a column-row configuration in which each column has a bit line (BL) and a bit line bar (BLB). For illustrative purposes, the array shown in FIG. 1 has four columns and thus four sets of bit lines BL[0-3] and BLB[0-3] (collectively bit lines BL,BLB). Each row of the array has a word line WLf-WLn (collectively word lines WL).

More specifically, the bit lines BL and BLB of each column are respectively coupled to a plurality of memory cells 14 that are disposed in that column, and each memory cell 14 in that column is arranged on a different row and coupled to a respective (different) word line WLf-WLn. That is, each memory cell 14 of the memory cell array 12 is coupled to a bit line pair BL/BLB of a column of the memory cell array 12 and a word line WLf-WLn of a row of the memory cell array 12. The word lines WLf-WLn are connected to word line driver circuits (not shown) that output a row, or word line select signal WL. In some embodiments, the bit lines BL/BLB are arranged in parallel vertically and the word lines WLf-WLN are arranged in parallel horizontally (i.e., perpendicular to the bit lines BL/BLB).

The bit lines BL/BLB of each column are coupled to an I/O circuit 16 that includes a column select circuit 18 and a sense amplifier ("sense amp") 100. The column select circuit 18 receives a column select signal RCS to select the desired column of the memory array 12 to transmit and receive data. The bit lines BL/BLB of the selected column are connected to the sense amp 100 by data lines DL and DLB. A sense amp control circuit 110 outputs a sense amp enable signal SAE to the sense amp 100, in response to which the sense amp 100 outputs data read from the memory array 12. As will be discussed further below, the sense amp control circuit 110 is configured to output the SAE signal based on a read margin (RM) of the memory array.

Figure 2:
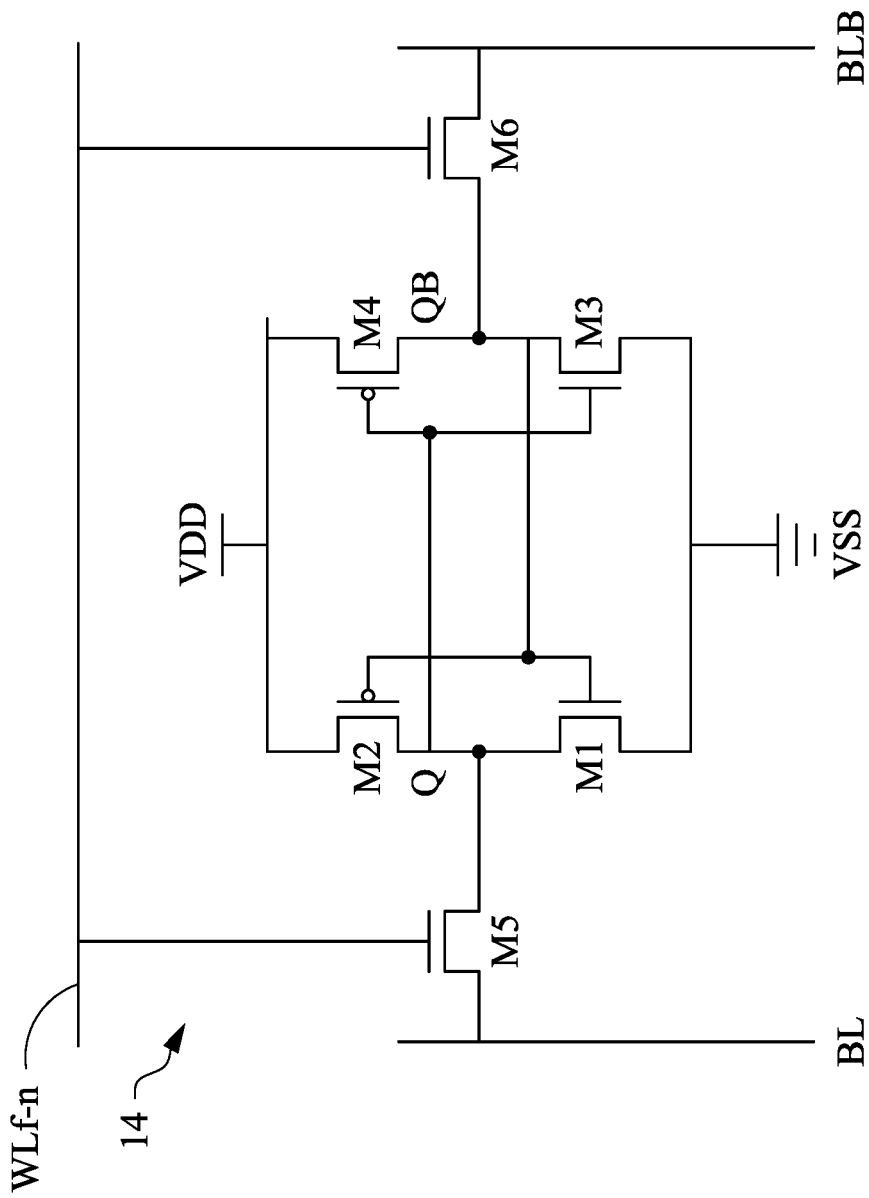
FIG. 2 is a circuit diagram of an example of a static random access memory (SRAM) cell in accordance with some embodiments.

As noted above, in some embodiments the memory device 10 is an SRAM memory, and thus the memory array 12 is an array of SRAM memory cells 14. Other memory types are within the scope of the disclosure. FIG. 2 illustrates further aspects of the memory device 10, including an example of an SRAM memory cell 14 of the memory cell array 12 shown in FIG. 1. The memory cell 14 is connected to one of the word lines WLf-WLn and a pair of the complementary bit lines BL and BLB.

The memory cell 14 includes PMOS transistors M2, M4 and NMOS transistors M1, M3, M5, M6. The transistors M1-M6 include source/drain (S/D) terminals and a gate terminal. As used herein, the S/D terminals generally may refer to a source or a drain, individually or collectively dependent upon the context. The transistors M1 and M2 are coupled to one another and positioned between the supply voltage VDD and ground to form a first inverter. Similarly, the transistors M3 and M4 are coupled between VDD and ground to form a second inverter. The two inverters are cross-coupled to each other. The cross coupled inverters of the memory cell 14 provide two stable voltage states denoting logic values 0 and 1.

An access transistor M5 connects the output Q of the first inverter to the bit line BL. Similarly, the access transistor M6 connects the output QB of the second inverter to the bit line bar BLB. The word line WL is attached to the gate terminals of the access transistors M5 and M6 to selectively couple the outputs of the inverters to the bit lines BL/BLB during read/write operations in response to the word line signal WL from the word line driver. In a read operation, for example, the bit lines BL/BLB are precharged to a predefined threshold voltage. When the word line is enabled, the data lines DL/DLB connect the selected bit lines BL/BLB to the sense amp 100, which senses and outputs the stored information.

Metal-Oxide Semiconductor Field Effect Transistors (MOSFETs) are typically used as the transistors in the memory cell 14. In some embodiments more or fewer than 6 transistors may be used to implement the memory cell 14.

Referring back to FIG. 1, the column select circuit 18 is configured to select a column with the memory cells 12 to be accessed based on a decoded column address provided from a column decoder which, in one or more embodiments, is included in a memory controller. The bit lines BL/BLB of the selected column are connected to the data lines DL/DLB by the column select circuit 18. In some disclosed examples, the column select circuit 18 includes a plurality of PMOS transistors 20 having one S/D terminal connected to a respective one of the bit lines BL and the other S/D terminal connected to the data line DL, and another plurality of PMOS transistors 22 having one S/D terminal connected to a respective one of the bit lines bar BLB and the other S/D terminal connected to the data line bar DLB. Gate terminals of the transistors 20, 22 receive the column select signal RCS, in response to which the selected bit line BL and bit line bar BLB are connected respectively to the data line DL and data line bar DLB.

Figure 3:
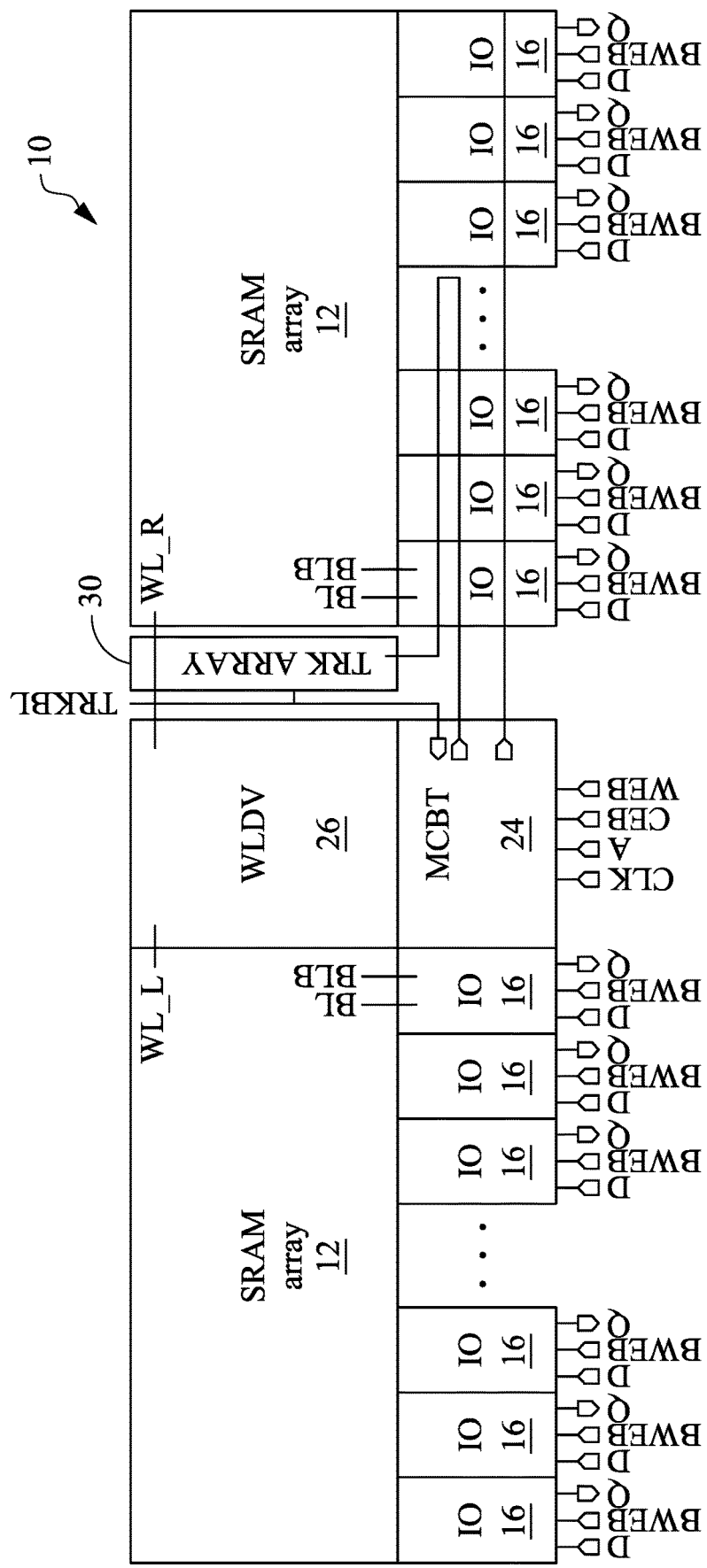
FIG. 3 is a bock diagram illustrating further aspects of an example of the memory device shown in FIG. 1 in accordance with some embodiments.

FIG. 3 illustrates further aspects of an example of the memory device 10. The example of FIG. 3 includes two memory arrays 12 arranged on either side of a memory controller 24 and a word line driver circuit 26. The memory arrays 12 are each connected to a plurality of the I/O circuits 16. The word line driver circuit 26 is configured to decode a memory address to obtain a row address and output the word line signal WL on the word line WLf-WLn for the appropriate row.

As noted above, in a read operation the bit lines BL/BLB are precharged to a predefined threshold voltage. When the WL signal is output by the word line driver circuit 26, the memory cell 14 of the selected column pulls down the corresponding BL/BLB voltage. The timing for the bit line voltage drop can be slow, for example, depending on bit cell sizing, bit line loading, etc. The sense amplifier 100 of the I/O circuits 16 is configured to accelerate the read out behavior. When the bit line voltage is sufficiently pulled down, the sense amp enable signal SAE is asserted, in response to which the sense amp 100 senses and latches the data signal on the data lines DL/DLB.

If the SAE signal is output too soon, the data signal on the data lines DL/DLB may not be sufficiently developed (i.e. signal on one of the data lines DL/DLB has not fallen sufficiently), read errors could occur. The illustrated example provides the tracking array 30 to determine timing of the SAE signal. The tracking array 30 includes tracking memory cells that are similar to the memory cells 14 of the arrays 12. Tracking word lines TRKWL and tracking bit lines TRKBL of the tracking array 30 are used to monitor the memory array behavior and provide this information to the memory controller 24. For instance, the SAE signal is typically output based on the voltage level of the tracking bit line TRKBL. In other words, once the tracking bit line TRKBL is pulled down sufficiently from the precharge level, the memory controller outputs a global SAE signal to enable the sense amps 100 of the I/O circuits 16 to sense and latch the data signal on the data lines DL/DLB.

The SAE signal is typically asserted such that the read margin (RM)—i.e. the voltage difference between the data lines DL and DLB—at a predetermined point in the transition of the SAE signal pulse is sufficient for the sense amp 100 to sense and latch the logic 0 and 1 data values on the data lines DL and DLB. However, this can result in reducing the overall read timing performance Tcd, which refers to the latency timing from the beginning of a read operation to the time that valid data is available on the output.

In some situations, the RM for the data lines DL/DLB may be larger than that of the tracking array. For instance, timing for bit line signals to develop is based on factors such as the bit line capacitance, supply voltage, memory cell current, and the like. Bit line voltage drop timing Tbldrop may be expressed as $$Tbldrop = C*V/Icell$$

Where C is the bit line capacitance, V is the supply voltage level, and Icell is the memory cell current. Thus, an increased supply voltage V can result in a faster Tbldrop. Similarly, a smaller array could also result in faster Tbldrop, such has an array with fewer I/O's (and thus fewer bit lines) and/or fewer rows (i.e. smaller word depth WD), by reducing capacitance C of the array.

Figure 4:
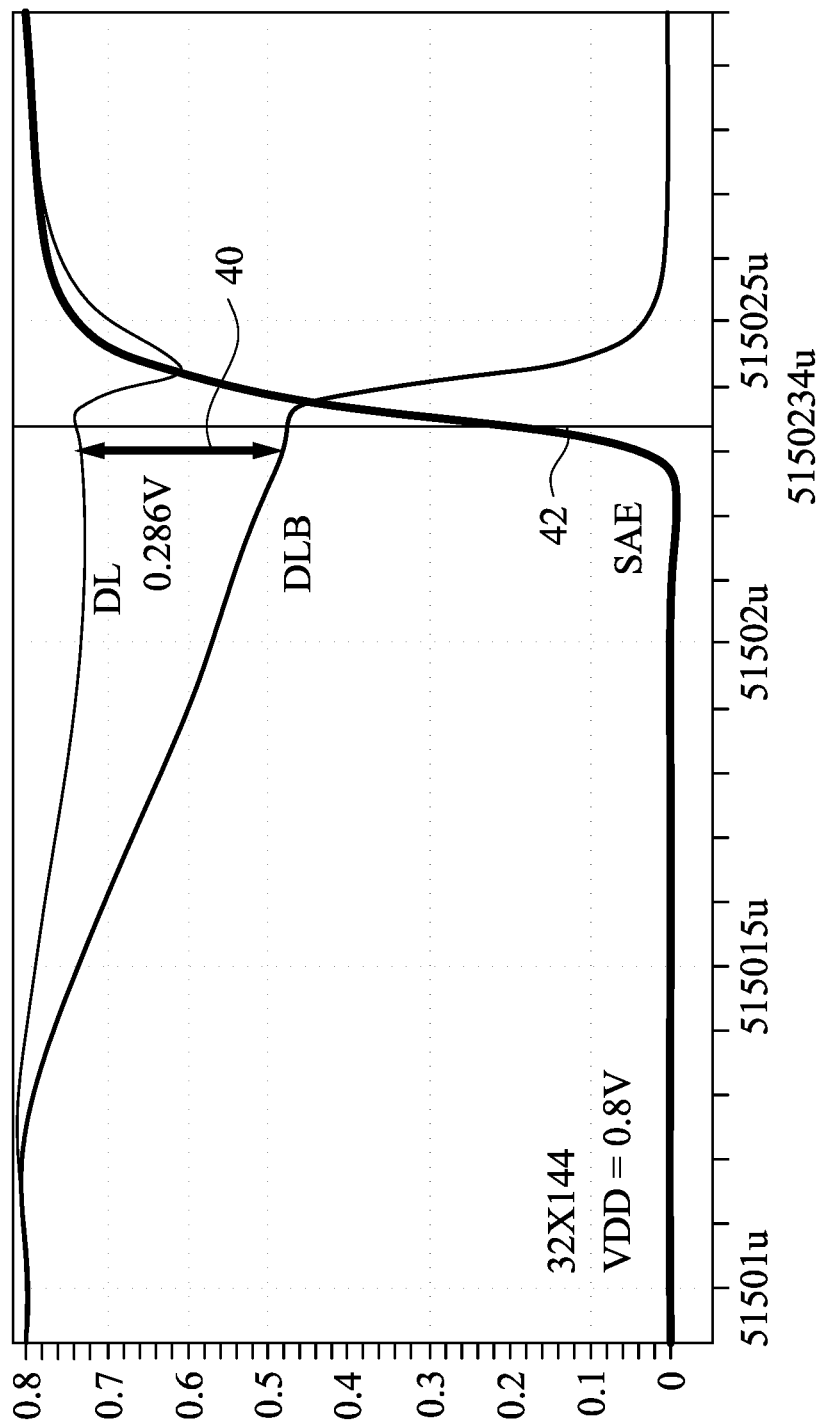
FIG. 4 is a graph illustrating a read margin (RM) for data lines of a memory array in accordance with some embodiments.

FIG. 4 illustrates a RM 40 for data lines DL/DLB of an I/O circuit 16 for a 32×144 memory array (32 I/O's and 144 rows) with a supply voltage of 0.8V. The vertical line 42 indicates a time at which the SAE pulse has risen about 200 mV. At this point, the RM 40 is 0.286V. As the SAE signal continues to rise, the sense amp 100 is enabled, which quickly pulls down the DLB voltage.

Figure 5:
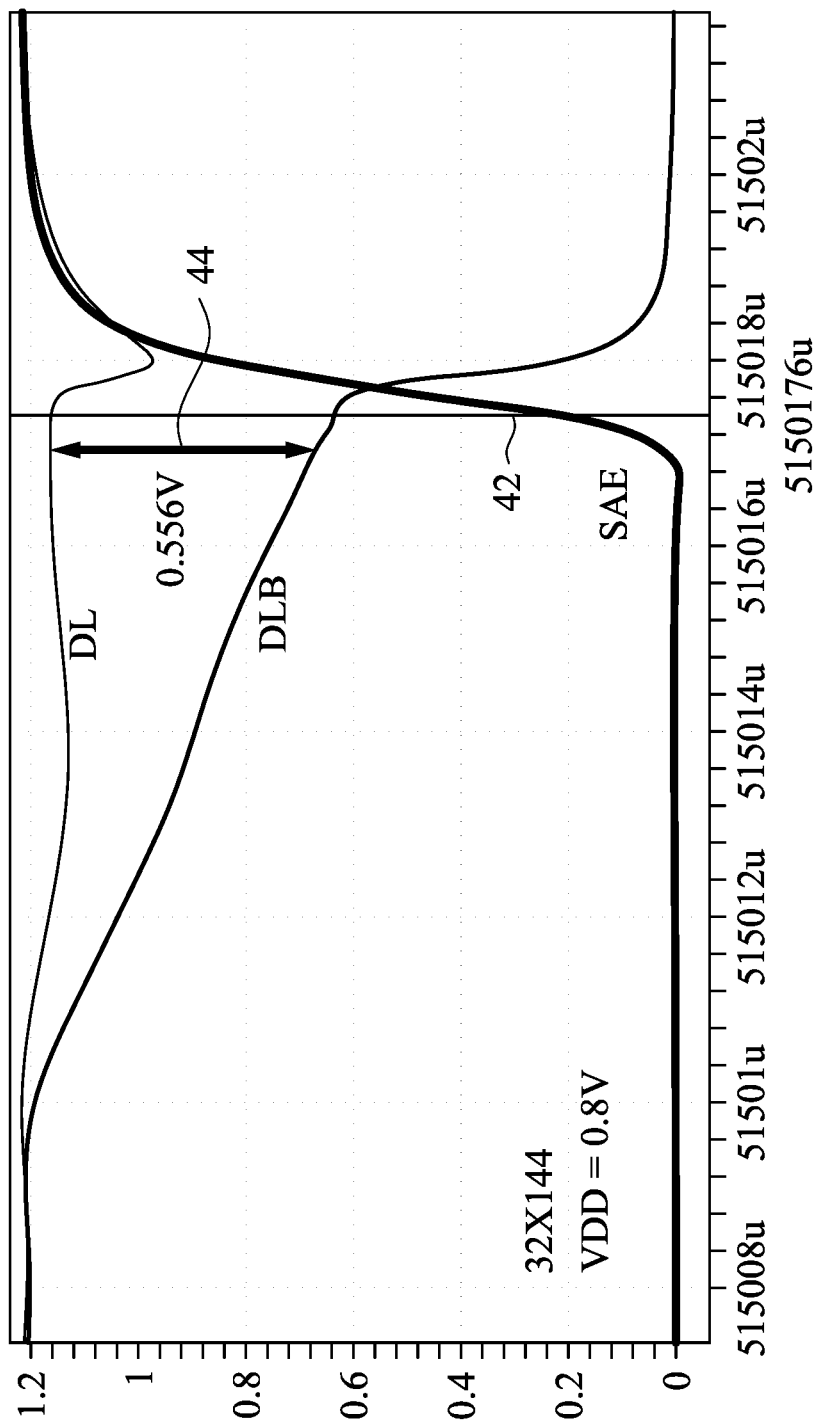
FIG. 5 is a graph illustrating a larger RM for data lines of a memory array in accordance with some embodiments.

In contrast, FIG. 5 illustrates a RM 44 for data lines DL/DLB of an I/O circuit 16 for a 32×144 memory array with a higher supply voltage of 1.2V. In the example of FIG. 5, the RM 44 at the point where the SAE has risen to about 200 mV is 0.556V. Thus, with the example of FIG. 5, the RM reached a level sufficient for operation of the sense amp 100 earlier than the timing indicated by the vertical line 42.

Figure 6:
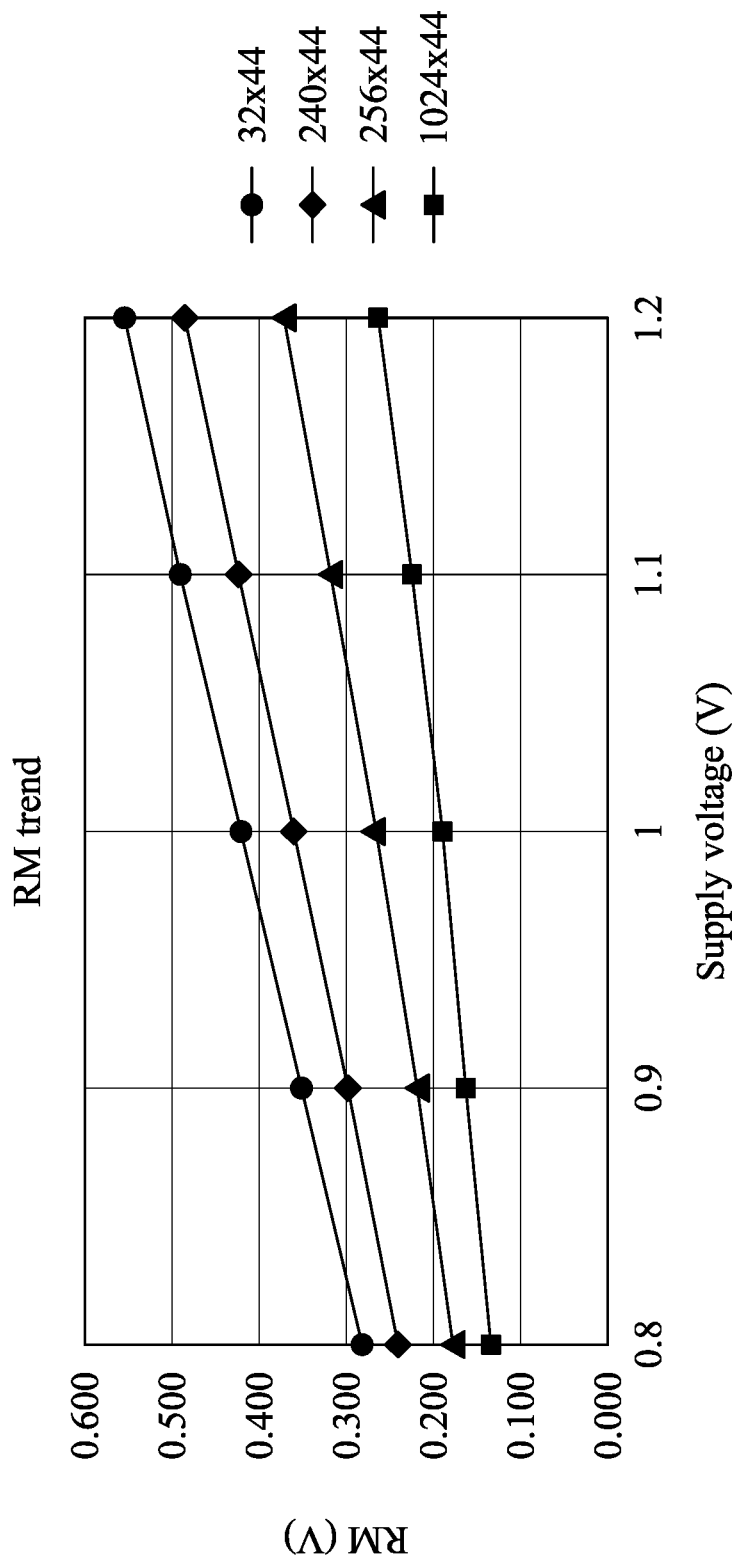
FIG. 6 is a graph illustrating RM trends for memory arrays having varying supply voltages and array sizes in accordance with some embodiments.

FIG. 6 is a graph illustrating RM trends for varying array sizes and supply voltages. FIG. 6 illustrates four curves corresponding to four array sizes: 32×144, 240×144, 256×144 and 1024×144, along with supply voltages that vary from 0.8V to 1.2V. As shown in FIG. 6, the RM increases with increases in supply voltages, and also increases as the array size is reduced.

Thus, Tcd can be improved by asserting the SAE signal earlier than the timing indicated based on the tracking bit line TRKBL in situations where the memory array 12 has a larger RM. Disclosed embodiments provide a sense amp control circuit 110 configured to initiate the SAE signal earlier in such situations where the memory array 12 has a larger read margin. In other words, the sense amp control circuit 110 is operable to selectively initiate the SAE signal earlier than the timing indicated by the tracking bit line TRKBL behavior based on the RM of the data lines DL/DLB.

Figure 7:
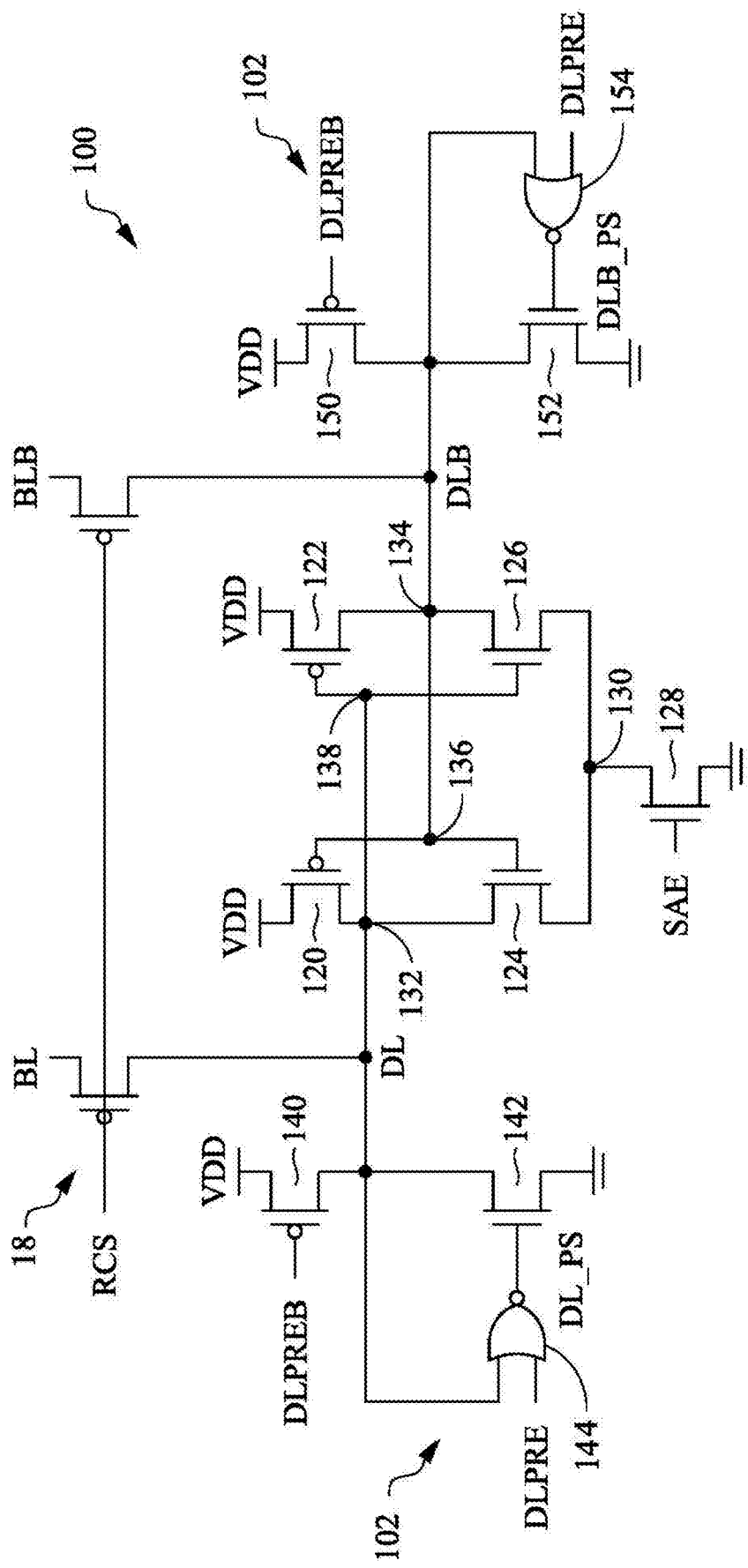
FIG. 7 is a circuit diagram illustrating an example of a sense amplifier system in accordance with some embodiments.

FIG. 7 illustrates an example of the sense amp 100 in accordance with aspects of the disclosure. The bit lines BL/BLB of the selected column are connected to the data lines DL/DLB based on the column select signal RCS received by the column select circuit 18. The sense amp 100 includes PMOS transistors 120, 122 and NMOS transistors 124, 126 connected to form two inverters. More specifically, the transistors 120 and 124 are coupled to one another and positioned between the supply voltage VDD and an enable node 130 to form a first inverter. Similarly, the transistors 122 and 126 are coupled between VDD and the node 130 to form a second inverter. The inverters formed by the transistors 120, 122, 124, 126 are cross coupled, with data output nodes 132, 134 for the respective complementary data lines DL and DLB connected to input nodes 136, 138 of the opposite inverters.

An NMOS transistor 128 is connected between the enable node and ground, and has its gate configured to receive the SAE signal. When the SAE signal goes high, the transistor 128 turns on to pull one of the data lines DL or DLB low, providing two stable voltage states denoting logic values 0 and 1 for the data lines DL/DLB.

The sense amp 100 includes a sense amp precharge circuit 102 that operates to precharge the data lines DL/DLB to a predetermined voltage level such as VDD. The example of the sense amp precharge circuit 102 shown in FIG. 7 includes a PMOS transistor 140 and NMOS transistor 142 connected in series between the source voltage VDD terminal and ground, with a NOR gate 144 having its output connected to the gate terminal of the transistor 142 to provide a data line pulse signal DL_PS thereto. The output node 132 of the sense amp 100 is connected to the data line DL, the junction of the PMOS transistor 140 and NMOS transistor 142, as well as to one input of the NOR gate 144. The other input of the NOR gate 144 is connected to receive a data line precharge signal DLPRE, which may be output by the memory controller 24, for example. The PMOS transistor 140 has its gate terminal connected to receive a data line precharge bar signal DLPREB.

The sense amp precharge circuit 102 includes a symmetrical arrangement connected to the data line bar DLB. More specifically, a PMOS transistor 150 and NMOS transistor 150 are connected in series between the source voltage VDD terminal and ground, with a NOR gate 154 having its output connected to the gate terminal of the transistor 152. The output node 134 of the sense amp 100 is connected to the data line bar DLB, the junction of the PMOS transistor 150 and NMOS transistor 152, as well as to one input of the NOR gate 154. The NOR gate 154 outputs a data line bar pulse signal DLB_PS to the gate of the transistor 152. As with the NOR gate 144, the other input of the NOR gate 154 is connected to receive the DLPRE signal and the PMOS transistor 150 has its gate terminal connected to receive the DLPREB signal. The example illustrated in FIG. 7 includes the NOR gates 144, 154, though implementation using gates other than NOR gates are within the scope of the disclosure.

For precharging the data lines DL/DLB, the DLPRE signal goes high, which holds the DL_PS and DLB_PS signals output respectively by the NOR gates 144 and 154 low, turning off the NMOS transistors 142 and 152. The complement of the DLPRE signal, DLPREB, is received at the gate of the transistors 140 and 150, turning on the PMOS transistors 140 and 150 and connecting the data lines DL/DLB to the VDD voltage terminal for precharging. Additional operations of the sense and precharge circuit 102 will be discussed further below.

Figure 8:
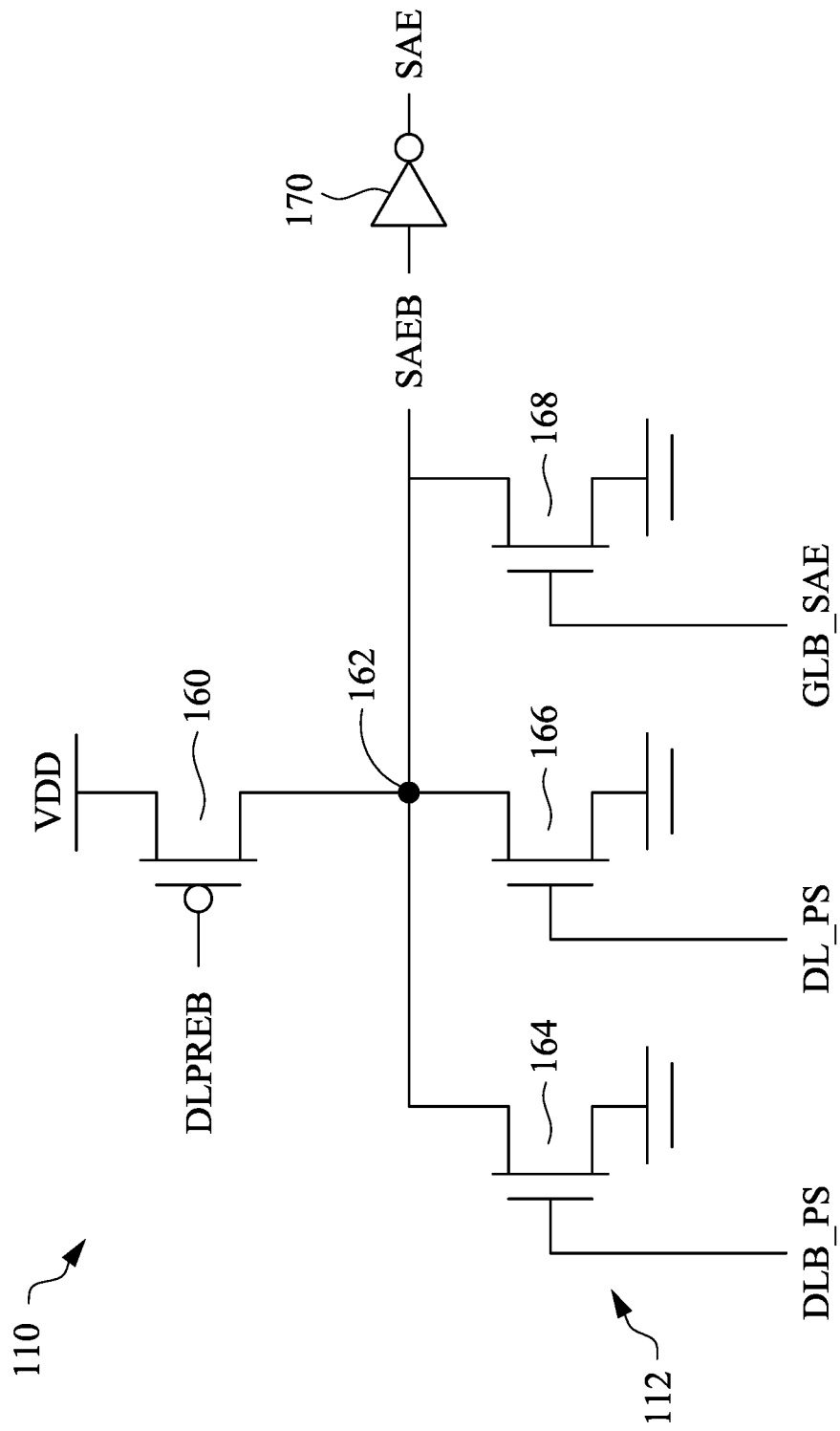
FIG. 8 is a circuit diagram illustrating an example of a sense amplifier enable circuit in accordance with some embodiments.

FIG. 8 illustrates an example of the sense amp control circuit 110. The sense amp control circuit 110 includes a logic circuit 112 that receives as inputs the DLB_PS and DL_PS signals output by the NOR gates 154 and 144, respectively, of the precharge circuit 102 shown in FIG. 7. The logic circuit 112 further receives a global sense app-amp enable bar signal GLB_SAE, which is output for example, by the memory controller 24 shown in FIG. 3. In some examples, the memory controller 24 outputs a global sense amp enable bar signal GLB_SAE based on the behavior of the memory array 12. In the example discussed in conjunction with FIG. 3, this is determined based on the behavior of the tracking array 30.

The logic circuit 112, which functions as a three input NOR gate in the example of FIG. 8, includes a PMOS transistor 160 connected between the VDD terminal and an intermediate node 162. The gate terminal of the transistor 160 is connected to receive the DLPREB signal. Three NMOS transistors 164, 166, 168 are connected in parallel between the intermediate node 162 and ground. The NMOS transistors 164, 166, 168 receive the DLB_PS, DL_PS and GLB_SAE signals at their respective gate terminals.

Thus, during a data line precharge operation, the DLPRE signal goes high and the DLPREB signal correspondingly goes low. The low DLPREB signal turns on the PMOS transistor 160, connecting the intermediate node 162 to VDD to precharge the intermediate node to the VDD level (i.e. logic 1). As such, the sense amp enable bar signal SAEB remains high as long as the DLB_PS, DL_PS and GLB_SAE signals received by the respective gates of the NMOS transistors 164, 166 and 168 are low. The sense amp control circuit 110 shown in FIG. 8 further includes an inverter 170 having its input terminal connected to the intermediate node 162 to receive the SAEB signal. Accordingly, the SAE signal remains low while the SAEB signal is high.

Conversely, the SAEB signal going low will cause the SAE signal output by the sense amp control circuit 110 to transition to high. Thus, a high input by any one of the DLB_PS, DL_PS or GLB_SAE signals at the respective gates of the NMOS transistors 164, 166 and 168 will result in a low SAEB signal input to the inverter 170, which will then output a high SAE signal output by the sense amp control circuit 110.

In other words, the sense amp control circuit 110 is configured to output the SAE signal based on whichever of the DLB_PS, DL_PS or GLB_SAE signals transitions to logic high first, or earliest. As noted above, in some situations the data lines DL/DLB may exhibit an RM larger than that indicated by the tracking array 30, such as for a smaller memory array 12 or an array having a higher source voltage VDD. In such instances, Tcd may be improved by enabling the sense amp 100 earlier than would be indicated by the GLB_SAE signal. Thus, the sense amp control circuit 110 is configured to selectively output the SAE signal based on the RM of the data lines DL/DLB or the GLB_SAE signal output by the memory controller 20 based on the tracking array 30.

More specifically, if the RM of the data lines DL/DLB is sufficient for operation of the sensor amp 100 (i.e. allows the cross coupled inverters of the sense amp 100 to latch the logic 1 and 0 at the appropriate output nodes 132, 134) before output of the GLB_SAE signal by the memory controller 20, the SAE signal is output based on the RM of the data lines DL/DLB. This is determined by timing of the falling data line DL or DLB from the precharge voltage level.

Referring again to FIG. 7, during data line precharge the DLPRE signal is high. The high DLPRE signal keeps the DL_PS and DLB_PS signals respectively output by the NOR gates 144, 154 low, and the low DLPREB connects the data line DL and data line bar DLB to VDD for precharging. The low DL_PS and DLB_PS signals are also received at the respective gates of the NMOS transistors 164, 166 of the logic circuit 112 shown in FIG. 8.

If the voltage difference between the data line DL and the data line bar DLB is less than the threshold of the NOR gates 144, 154 shown in FIG. 7, their outputs DL_PS and DLB_PS will remain low. During a read operation, the voltage level of one of the data line DL or data line bar DLB will begin to fall based on current in the selected memory cell 14. If the memory controller 20 outputs the GLB_SAE before the voltage difference of the data line DL and data line bar DLB exceed the threshold of the NOR gates 144, 154, the low GLB_SAE signal received by the PMOS transistor 168 will cause the sense amp control circuit 110 to output the SAE signal based on the GLB_SAE signal.

Figure 9:
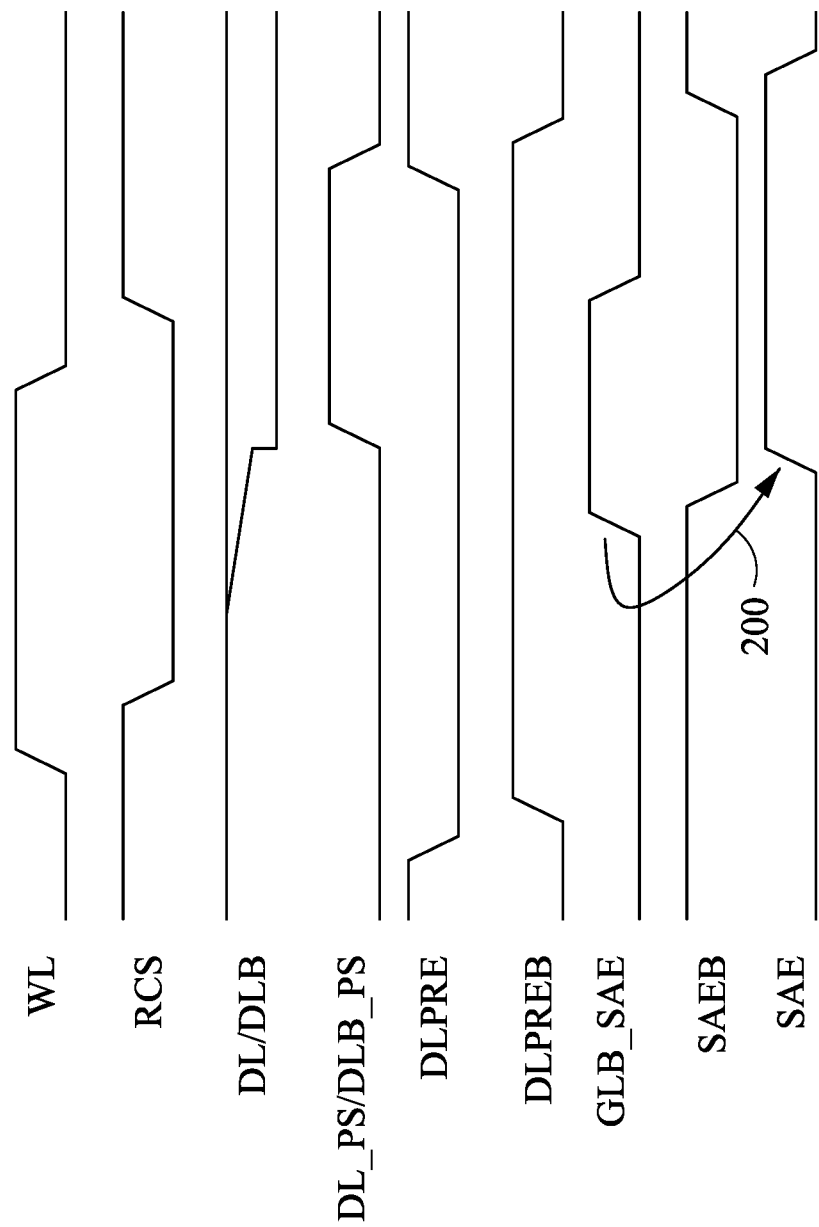
FIG. 9 is a timing diagram illustrating example waveforms for various signals of the disclosed memory device in accordance with some embodiments.

FIG. 9 is a timing diagram illustrating various waveforms for a memory array 12 having a smaller read margin, such as that illustrated in FIG. 4 discussed above. Initially, the sense amp precharge circuit 102 shown in FIG. 7 precharges the data lines DL/DLB to the VDD level based on the data line precharge signals DLPRE/DLPREB received by the transistors 140, 150 and NOR gates 144, 154. For a read operation, the word line signal WL is subsequently output on the appropriate word line WLf-WLn by the word line driver 30, and the column select signal RCS is output to the column select circuit 18 to connect the desired bit lines BL/BLB to the data lines DL/DLB. The current in the selected memory cell 14 causes the data line voltage to begin to drop. In the example shown in FIG. 9, the data line DL begins to fall from the precharge level (i.e. data 0 to be read out). At a time based on the tracking array 30, the memory controller 20 outputs the GLB_SAE signal. In FIG. 9, the GLB_SAE signal is output before the voltage difference between the data line DL and data line bar DLB exceeds the threshold of the NOR gates 144, 154. As such, the sense amp control circuit 110 outputs the SAE signal based on the timing of the tracking array 30 (i.e. output of the GLB_SAE signal) as indicated by the arrow 200 in FIG. 9.

Figure 10:
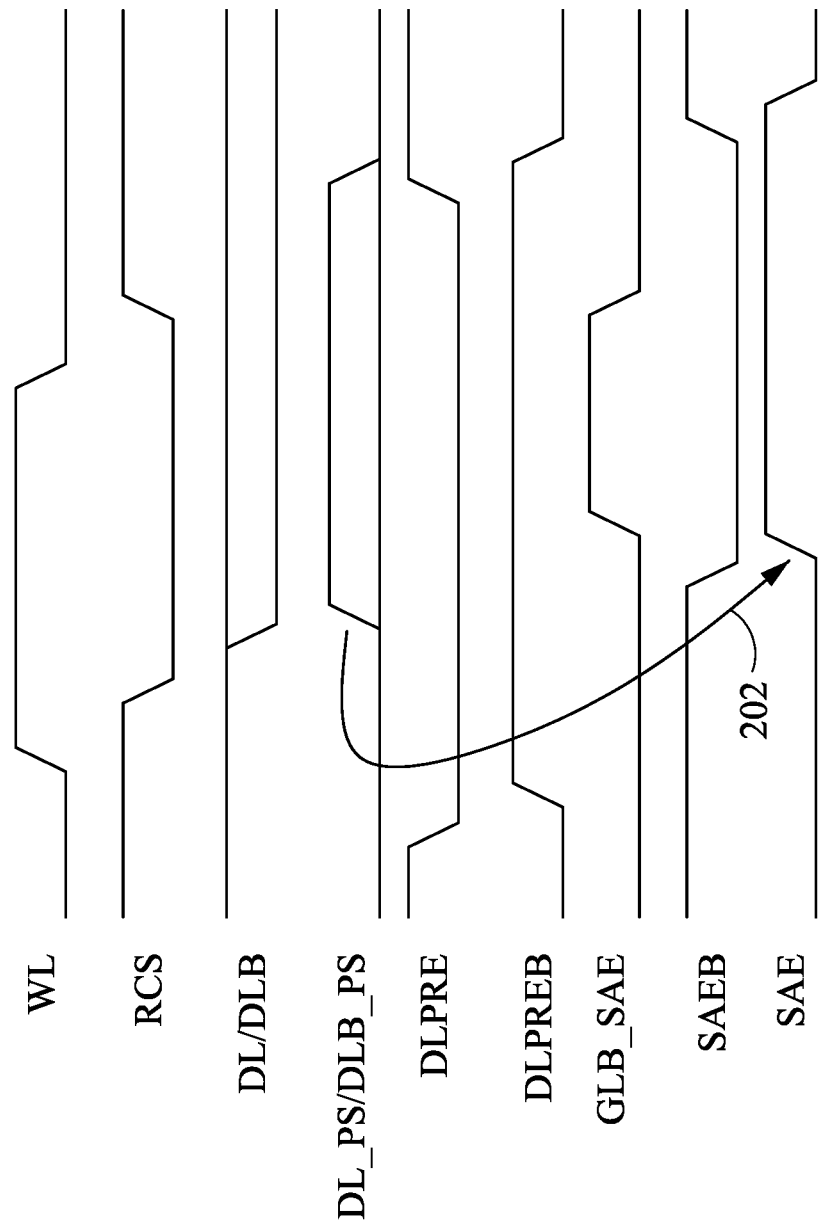
FIG. 10 is a timing diagram illustrating further example waveforms for various signals of the disclosed memory device in accordance with some embodiments.

However, if the RM of the data lines DL/DLB is higher, such as with the example shown in FIG. 5, Tcd may be improved by outputting the SAE signal earlier to read the data faster. FIG. 10 is a timing diagram illustrating such a situation. After precharging the data lines DL/DLB, the DLPRE signal transitions to low. The high DL and DLB signals keep the NOR gates 144, 154 off and the DL_PS and DLB_PS signals correspondingly low.

Following assertion of the word line WL and column select RCS signals, the current in the selected memory cell 14 causes the data line DL voltage to begin to drop (i.e. data 0 to be read out). In the example shown in FIG. 10, the data line DL falls from the precharge level at a faster rate than that of the example shown in FIG. 9. When the data line DL voltage drops to a level that exceeds the threshold of the NOR gate 144 (i.e. approaches a logic low level), the DL_PS signal output by the NOR gate 144 goes high. This causes the NMOS transistor 142 to begin to conduct, pulling the data line DL signal low faster.

The high DL_PS signal is also received by the PMOS transistor 166 of the logic circuit 112 shown in FIG. 8, pulling down the signal on the intermediate node 162 and causing the SAEB signal to go low. The inverter 170 inverts the low SAEB signal and results in the sense amp control circuit 110 outputting the SAE signal based on the DL_PS signal as indicated by the arrow 202 shown in FIG. 10. In this example, the DL_PS signal indicates or provides a proxy for the RM of the data lines DL/DLB. In other words, the SAE signal is output based on the RM of the data line, rather than the SAE signal being based on the global SAE signal GLB_SAE based on the behavior of the tracking array 30 shown in FIG. 3.

Figure 11:
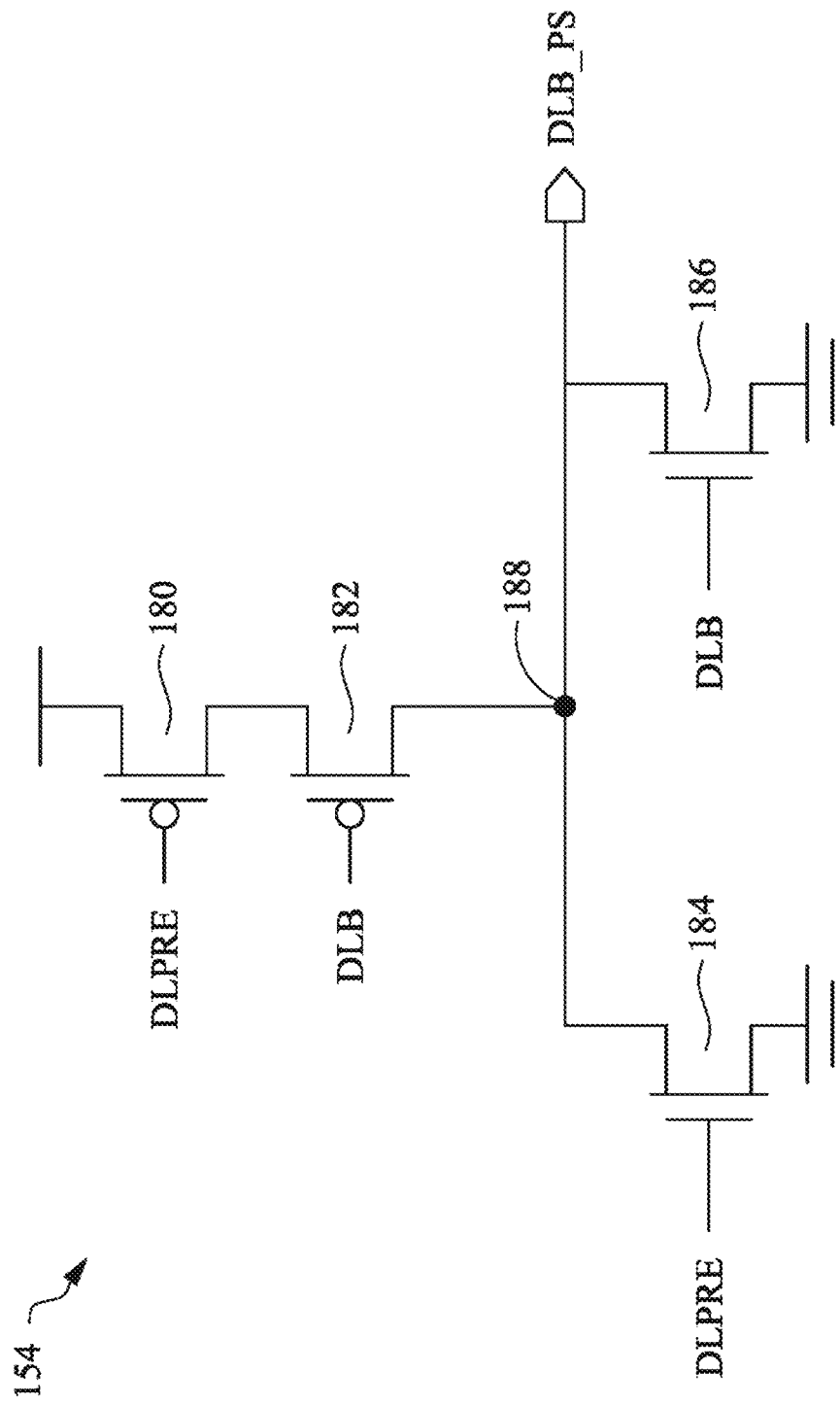
FIG. 11 is a circuit diagram illustrating an example of a NOR circuit implementing a NOR gate shown in FIG. 7.

FIG. 11 illustrates an example of a circuit for implementing the NOR gates 144/154 shown in FIG. 7. The circuit shown in FIG. 11 is for the NOR gate 154 of FIG. 7, though the structure of a circuit for the NOR gate 144 is identical. The NOR circuit shown in FIG. 11 includes series connected PMOS transistors 180, 182 connected in series with parallel connected NMOS transistors 184, 186 at an output node 188. The transistors 180 and 184 receive the DLPRE signal at their gate terminals, and the transistors 182 and 186 receive the DLB signal at their gate terminals (for the NOR gate 144 of FIG. 7, the transistors 182 and 186 would be connected to receive the DL signal at their gates). Other configurations for the NOR gates 144/154 are within the scope of the disclosure.

As noted above, after precharging the data lines DL/DLB, the DLPRE signal transitions to low. This turns on the PMOS transistor 180 and turns NMOS transistor 184 off. The precharged high DLB signal keeps PMOS transistor 182 off and the NMOS transistor 186 on, resulting in a logic low DLB_PS signal output by the NOR gates 154. Following assertion of the word line WL and column select RCS signals for a read operation, the current in the selected memory cell 14 causes the data line DL or data line bar DLB voltage to begin to drop, depending on the data value to be read out. When the data to be read out is logic 1, the data line bar DLB signal will begin to fall from the precharge level. When the data line DLB voltage drops to a level that exceeds the threshold of the PMOS transistor 182, the transistor 182 turns on and connects the output node 188 to the VDD terminal. The low DLB signal also turns the NMOS transistor 186 off, resulting in a high DLB_PS signal output by the NOR gate 154.

The PMOS transistors 180, 182 of the NOR gate 154 have a lower threshold voltage Vt than that of the NMOS transistors 184, 186, which results in connecting the output node 188 to the VDD terminal quickly to charge the output node. In some examples, the Vt for the PMOS transistors is between 200 and 250 mV, such that the NOR gates 144,154 turn on before assertion of the GLB_SAE signal for a datalines DL/DLB having a higher RM, such as in the example of FIG. 5. Thus, if the RM of the data line DL/DLB reaches or exceeds a predetermined value (e.g. the Vt of one or more of the transistors 180, 182, 184, 186) prior to assertion of the GLB_SAE signal by the memory controller 20, the SAE signal is output based on the RM of the data lines DL/DLB rather than the GLB_SAE signal.

Figure 12:
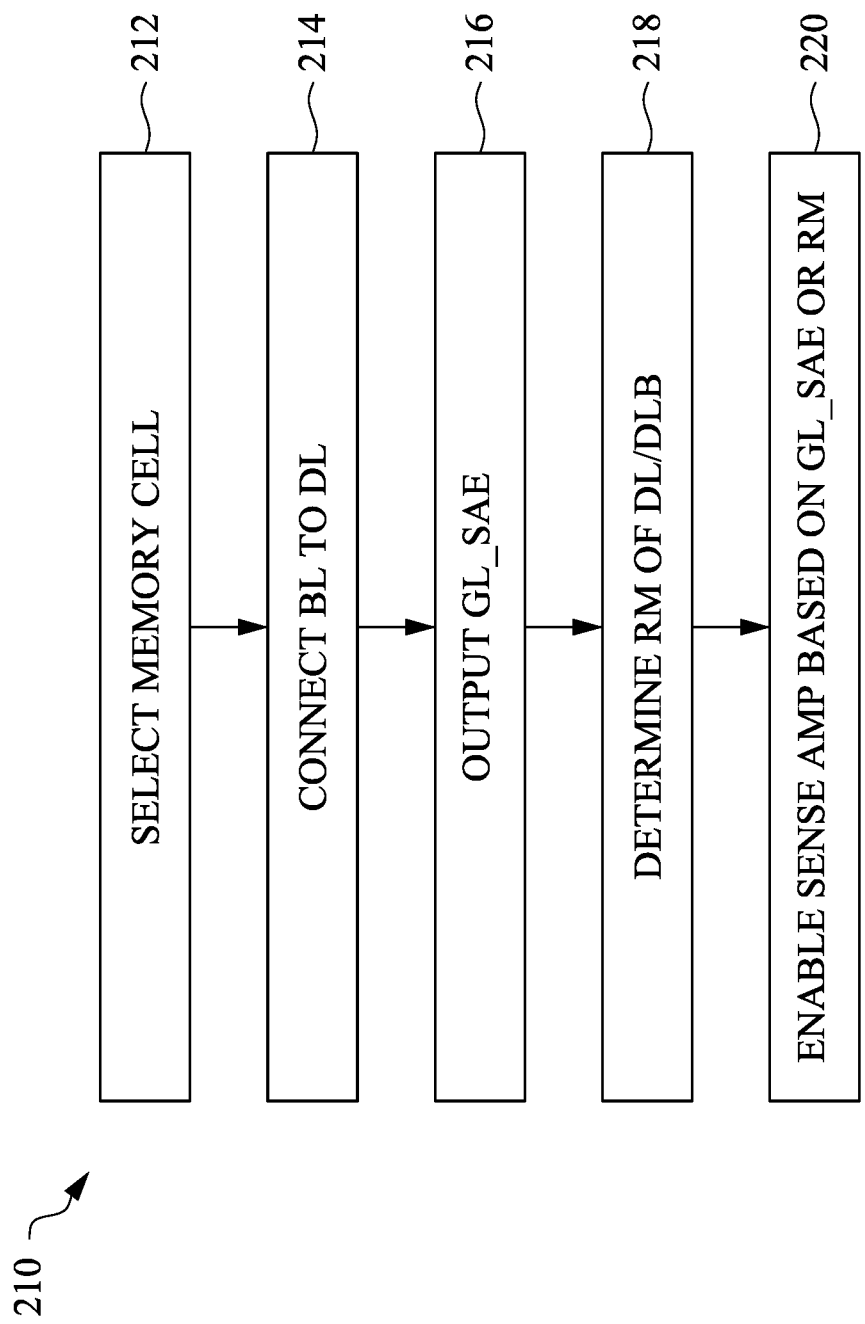
FIG. 12 is a flow diagram illustrating an example method in accordance with some embodiments.

FIG. 12 illustrates aspects of a method 210 for operating a memory array in accordance with aspects of the present disclosure. Referring to the flowchart of FIG. 12 together with FIG. 1, in an operation 212, a memory cell 14 of a memory array 12 is selected. The memory cell 14 is connected to bit lines BL/BLB. In operation 214, the bit lines BL/BLB connected to the selected memory cell 14 are connected to the data lines DL/DLB. In some examples, the bit lines BL/BLB are connected to the data lines DL/DLB by the column select circuit 18 based on a column address. In operation 216, a global enable signal GLB_SAE is output by the memory controller 20 based on a behavior of the memory array 12. In some examples, the behavior of the memory array 12 is based on the tracking array 30, and more specifically, the tracking bit line TRKBL and/or the tracking word line TRKWL. A RM of the data lines DL/DLB is determined in operation 218. For example, the RM may be determined based on a voltage level of the data lines DL/DLB. More particularly, the RM of the data lines DL/DLB may be based on the voltage level thereof exceeding the threshold of the NOR gate 144 and/or the NOR gate 154 as indicated by the outputs DL_PS and/or DLB_PS shown in in FIG. 7. In operation 220, the sense amplifier 100 is enabled based on one of the global enable signal GLB_SAE or the read margin (e.g., as indicated by the DL_PS and/or DLB_PS signals).

Disclosed embodiments thus provide a sense amplifier system that operates to improve Tcd of a memory system 10 by selectively enabling a sense amp 100 based on RM of its data lines DL/DLB. If the data lines DL/DLB demonstrate a sufficient RM prior to issuance of a global enable signal GLB_SAE by the memory controller 20, the sense amp enable signal SAE is output based on the RM. If the RM does not reach a predetermined RM prior to issuance of the global enable signal GLB_SAE by the memory controller 20, the sense amp enable signal SAE is output based on the GLB_SAE signal.

Thus, in accordance with some disclosed embodiments, a memory device includes an array of memory cells, with each of the memory cells being connected to a bit line and a word line. Each of the bit lines is selectively connectable to a data line. A sense amplifier is connected to the data line and is configured to provide a data output in response to a sense amplifier enable signal. A sense amplifier control circuit is connected to the enable terminal and is configured to output the sense amplifier enable signal in response to a read margin of a data signal on the data line.

In accordance with further embodiments, a sense amplifier system includes a first output node connected to a first data line, and the first data line is selectively connectable to a first bit line of a memory array. A second output node is connected to a second data line, and the second data line is selectively connectable to a second bit line of the memory array. An enable terminal is configured to receive a sense amplifier enable signal. A precharge circuit is configured to connect the first and second data lines to a source voltage terminal in response to a precharge signal. A sense amplifier control circuit is connected to the enable terminal and is configured to output the sense amplifier enable signal in response to one of an output of the precharge circuit or a global enable signal output by a memory controller.

In accordance with still further examples, a method for operating a memory array includes selecting a memory cell of a memory array. The memory cell is connected to a bit line. The bit line is connected to a data line, and a global enable signal is output based on a behavior of the memory array. A read margin of the data line is determined, and a sense amplifier connected to the data line is enabled based on one of the global enable signal or the read margin.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   an array of memory cells, each of the memory cells connected to a bit line and a word line;
   each of the bit lines selectively connectable to a data line;
   a sense amplifier connected to the data line and configured to provide a data output in response to a sense amplifier enable signal; and
   a sense amplifier control circuit connected to the enable terminal and configured to output the sense amplifier enable signal in response to a read margin of a data signal on the data line.

2. The memory device of claim 1, further comprising a memory controller configured to output a global enable signal, wherein the sense amplifier control circuit is configured to output the sense amplifier enable signal in response to one of the read margin of the data signal of the global enable signal.

3. The memory device of claim 2, wherein the sense amplifier control circuit is configured to output the sense amplifier enable signal in response to the read margin of the data signal if the read margin of the data signal reaches a predetermined value before the memory controller outputs the global enable signal.

4. The memory device of claim 2, wherein the sense amplifier control circuit is configured to output the sense amplifier enable signal in response to the global enable signal if the memory controller outputs the global enable signal before the read margin of the data signal reaches a predetermined value.

5. The memory device of claim 2, further comprising a tracking array, wherein the memory controller is configured to output the global enable signal based on the tracking array.

6. The memory device of claim 1, wherein the memory cells include SRAM memory cells.

7. The memory device of claim 2, wherein the sense amplifier includes a sense amplifier precharge circuit configured to precharge the data line in response to a precharge signal.

8. The memory device of claim 7, wherein the sense amplifier precharge circuit includes a NOR gate having a first input connected to the data line and a second input connected to receive the precharge signal, wherein the sense amplifier control circuit is configured to output the sense amplifier enable signal in response to an output of the NOR gate.

9. The memory device of claim 8, wherein the sense amplifier control circuit includes:
 a first input connected to receive a precharge signal, wherein the sense amplifier circuit is configured to precharge an output node based on the precharge signal;
 a second input connected to receive the global enable signal;
 a third input configured to receive the output of the NOR gate; and
 wherein the sense amplifier control circuit is configured to output the sense amplifier enable signal in response to the second input or the third input.

10. The memory device of claim 9, wherein the sense amplifier control circuit includes an inverter connected to the output node.

11. The memory device of claim 1, further comprising a column select circuit configured to connect a selected one of the bit lines to the data line in response to a memory address.

12. A sense amplifier system, comprising:
 a first output node connected to a first data line, wherein the first data line is selectively connectable to a first bit line of a memory array;
 a second output node connected to a second data line, wherein the second data line is selectively connectable to a second bit line of the memory array;
 an enable terminal configured to receive a sense amplifier enable signal;
 a precharge circuit configured to connect the first and second data lines to a source voltage terminal in response to a precharge signal; and
 a sense amplifier control circuit connected to the enable terminal and comprising:
  a first input terminal connected to a first output of the precharge circuit;
  a second input terminal connected to a second output of the precharge circuit; and
  a third input terminal connected to receive a global enable signal output by a memory controller;
 wherein the sense amplifier control circuit is configured to output the sense amplifier enable signal in response to one of the first output of the precharge circuit, the second output of the precharge circuit, or the global enable signal output by the memory controller.

13. The sense amplifier system of claim 12, further comprising:
 a first inverter including the first output node and a first input node;
 a second inverter including the second output node and a second input node, wherein the first input node is connected to the second output nod and the second input node is connected to the first output node; and
 an enable transistor connected between the first and second inverters and ground, wherein the enable transistor includes a gate terminal connected the enable terminal.

14. The sense amplifier system of claim 12, wherein the precharge circuit includes:
 a first PMOS transistor connected between the first output node and the source voltage terminal, the first PMOS transistor having a gate terminal connected to receive a negative of the pre-charge signal;
 a second PMOS transistor connected between the second output node and the source voltage terminal, the second PMOS transistor having a gate terminal connected to receive the negative of the pre-charge signal;
 a first NOR gate having a first input connected to the first output node, a second input connected to receive the precharge signal, and an output terminal;
 a second NOR gate having a first input connected to the second output node, a second input connected to receive the precharge signal, and an output terminal;
 a first NMOS transistor connected between the first PMOS transistor and ground, the first NMOS transistor having a gate terminal connected to the output terminal of the first NOR gate;
 a second NMOS transistor connected between the second PMOS transistor and ground, the second NMOS transistor having a gate terminal connected to the output terminal of the second NOR gate; and
 wherein the sense amplifier control circuit is configured to output the sense amplifier enable signal in response to one of an output of first NOR gate or an output of the second NOR gate.

15. The sense amplifier system of claim 12, wherein the sense amplifier control circuit is configured to output the sense amplifier enable signal in response to one of the read margin or the data signal of the global enable signal.

16. The sense amplifier system of claim 1, wherein the sense amplifier control circuit includes:
 a precharge transistor connected between the source voltage terminal and an output node;
 a first input transistor connected to the output node and having a gate terminal connected to the first input terminal;
 a second input transistor connected to the output node and having a gate terminal connected to the second input terminal;
 a third input transistor connected to the output node and having a gate terminal connected to the third input terminal; and
 an inverter connected to the output node.

17. A method, comprising:
 selecting a memory cell of a memory array, the memory cell connected to a bit line;
 connecting the bit line to a data line;
 outputting a global enable signal based on a behavior of the memory array by a memory controller;
 determining a read margin of the data line; and
 enabling a sense amplifier connected to the data line based on one of the global enable signal if the global enable signal is output before the data line reaches the determined voltage level or the read margin.

18. The method of claim 17, wherein outputting the global enable signal based on the behavior of the memory array includes monitoring a tracking bit line of a tracking array.

19. The method of claim 17, wherein determining the read margin of the data line includes determining when the data line reaches a predetermined voltage level.

20. The method of claim 17, further comprising outputting a sense amplifier enable signal in response to the global enable signal if the memory controller outputs the global enable signal before the read margin of the data signal reaches a predetermined value.

\* \* \* \* \*